(12) United States Patent
Girard et al.

(10) Patent No.: US 8,694,477 B2
(45) Date of Patent: Apr. 8, 2014

(54) METHOD FOR OPTIMIZING THE STORAGE OF CALIBRATION DATA IN AN AUTOMOBILE ELECTRONIC CONTROL UNIT

(75) Inventors: Jean-François Girard, Labarthe-sur-Lèze (FR); Romain Lafuente, Frouzins (FR); Jean-Christophe Seguy, Grenade (FR); Jean-Philippe Trede, Le Beausset (FR); Franck Valero, Muret (FR)

(73) Assignee: Continental Automotive France, Toulouse (FR)

( * ) Notice: Subject to any disclaimer, the term of this patent is extended or adjusted under 35 U.S.C. 154(b) by 336 days.

(21) Appl. No.: 13/258,685

(22) PCT Filed: Apr. 22, 2010

(86) PCT No.: PCT/EP2010/002474
§ 371 (c)(1),
(2), (4) Date: Oct. 26, 2011

(87) PCT Pub. No.: WO2010/124809
PCT Pub. Date: Nov. 4, 2010

(65) Prior Publication Data
US 2012/0041930 A1 Feb. 16, 2012

(30) Foreign Application Priority Data
Apr. 29, 2009 (FR) ...................................... 09 02084

(51) Int. Cl.
*G06F 7/00* (2006.01)
*G06F 17/00* (2006.01)
(52) U.S. Cl.
USPC ........................................................ 707/695
(58) Field of Classification Search
USPC ............................ 707/638, 695; 701/22, 29.1
See application file for complete search history.

(56) References Cited

U.S. PATENT DOCUMENTS

| 5,459,854 | A  | * | 10/1995 | Sherer et al. ...................... 713/1 |
| 5,600,823 | A  | * | 2/1997  | Sherer et al. ..................... 703/20 |
| 7,774,382 | B2 | * | 8/2010  | Franke et al. .................. 707/804 |
| 2005/0240287 | A1 | * | 10/2005 | Glanzer et al. .................. 700/18 |
| 2007/0038700 | A1 | * | 2/2007  | Eryurek et al. ............... 709/203 |
| 2008/0270427 | A1 | * | 10/2008 | Franke et al. ................. 707/100 |

FOREIGN PATENT DOCUMENTS

| CN | 101233461 A | 7/2008 |
| DE | 19963475    | 3/1994 |
| DE | 10234063    | 2/2004 |
| EP | 1501196     | 1/2005 |

OTHER PUBLICATIONS

International search report dated Jul. 1, 2010 in corresponding PCT/EP2010/002474.

* cited by examiner

*Primary Examiner* — Hosain Alam
*Assistant Examiner* — Van Oberly
(74) *Attorney, Agent, or Firm* — Young & Thompson

(57) ABSTRACT

A method for storing, in the rewritable memory of an automobile electronic control unit, calibration data functionally equivalent to a set of various models (M1-M5) of complete calibration data, this method including operations consisting in recording a single copy (CALIBAS) of common calibration data (COM1-COM4), and specific calibration data (SP1-SP5) relieved of these common data. The method uses the relations existing between the various versions (SP1-SP5) of specific data to further reduce the memory space dedicated to storage by defining, from among these versions, standard versions (T1; T2) and variants (V11; V21, V22), the variants being relieved of data already contained in the standard versions (T1; T2).

10 Claims, 1 Drawing Sheet

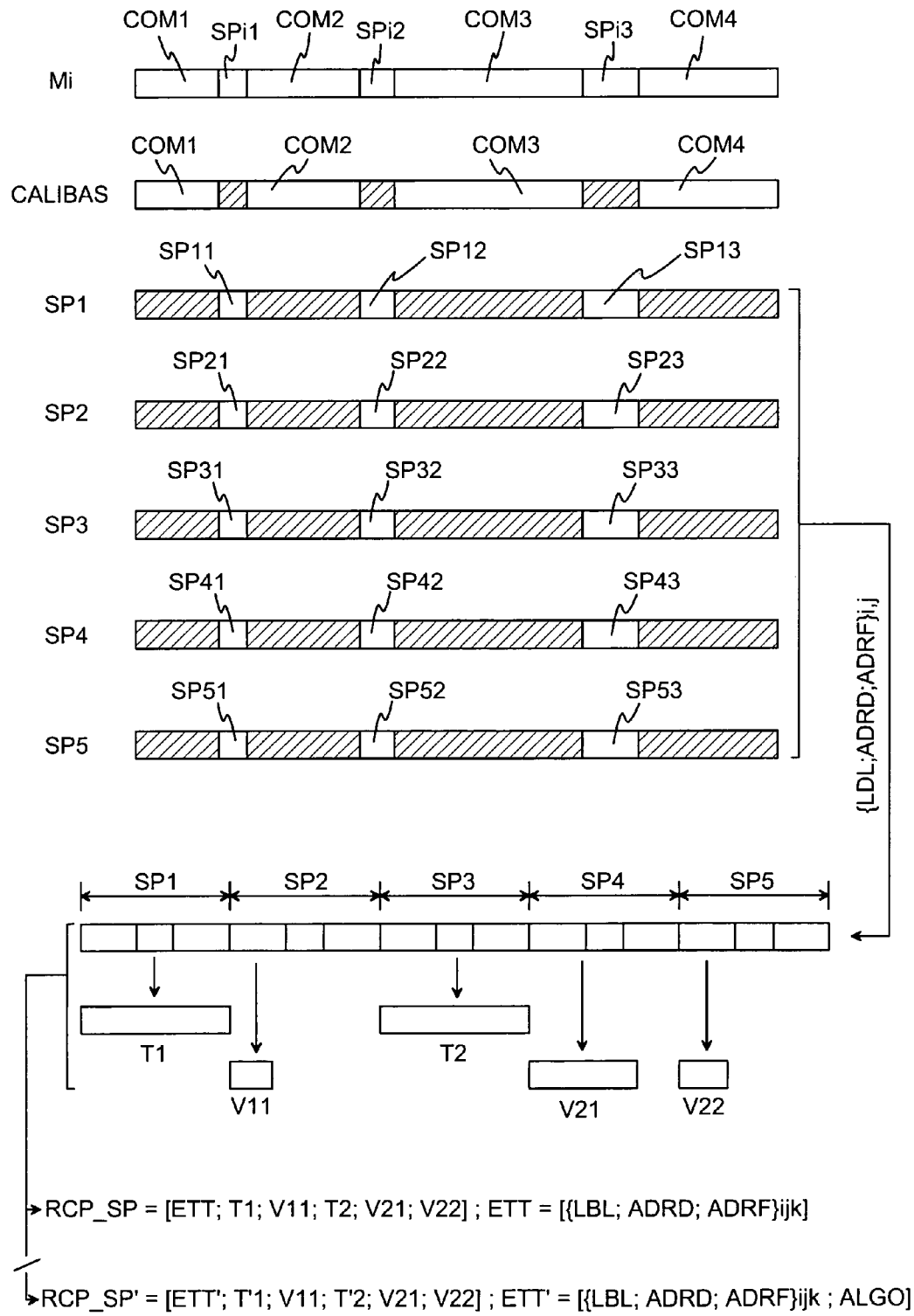

METHOD FOR OPTIMIZING THE STORAGE OF CALIBRATION DATA IN AN AUTOMOBILE ELECTRONIC CONTROL UNIT

The present invention relates, generally, to the processing and storage of data.

More precisely, the invention relates to a method for storing, in a rewritable memory of an automobile electronic control, unit, calibration data functionally equivalent to a set of various models of complete calibration data, this method comprising operations consisting in recording in the rewritable memory a set of common calibration data, consisting of the calibration data common to the various models of complete data, and a set of versions of specific calibration data, each version of specific data consisting of a subset of a corresponding model of complete data and being disjoint from the set of common data, Modern automobile electronic control units, also called "ECUs" (the abbreviation standing for "Electronic Control Unit") by the person, skilled in the art, comprise, in their memory, software and data required for the operation of the vehicle in which they are installed.

Typically, these electronic control units comprise in particular:

software containing diagnostic and reprogramming functions and called the "Boot Loader" by the person skilled in the art, an application software package containing the application specific to the vehicle and called the "ASW" by the person skilled in the art, and one or more calibration files containing data calibrating the application functions of the ASW software, and ensuring correct implementation of the vehicle functions.

During the manufacture of the electronic control unit, the Boot Loader and ASW software, together with a calibration file specific to a vehicle and to its application (that is to say to the country of destination of the vehicle, to the options assembled in this vehicle, etc.), are chosen and loaded, into the memory of the electronic control unit. Once provided with this software and these data, the electronic control unit becomes specific to this application and to this vehicle and receives a production reference number containing a calibration serial number. For one and the same vehicle, there therefore exist as many references of electronic control units as there exist calibrations, that is to say applications for this vehicle. After manufacture, this electron control unit is dispatched to a vehicle assembly plant, so as to be installed in the specific vehicle for which it is intended, As each assembly plant usually manufactures one type of vehicle intended for several different applications, each plant must manage several references of electronic control units, these electronic control units containing different calibrations.

To reduce the complexity of managing these various versions of electronic control units and to increase the flexibility of assembly in the plants, automobile constructors ask electronic control unit manufacturers to supply them with electronic control units each containing several calibration files, so as to be able to choose at the end of the assembly line the calibration file to be loaded into the electronic control unit, according to the application and the vehicle for which this electronic control unit is intended. Thus, for one and the same type of vehicle, the assembly plant needs therefore now to manage only a single electronic control unit reference, this electronic control unit being delivered with a complete suite of calibration data.

Although this approach achieves in a totally satisfactory manner its objective of simplifying- the management of the electronic control units, it leads on the other hand to inconvenient and considerable bulkiness of the memory of these electronic control units.

It is known, in particular through patent application US 2008/0 270 427, to reduce the memory size occupied by the calibration files by identifying data common to the whole set of these files, and by storing in memory data which are common to the whole set of these calibrations and data which are specific to the various calibrations, the common data being intended to be supplemented, during their utilization, with the specific data of the calibration which is ultimately chosen and thus being able to be stored as lust a single copy.

The present invention, to which this context pertains, is aimed at proposing a method for storing calibration data in an automobile electronic control unit which makes it possible to further reduce the memory space allocated to the storage of a suite of calibration data.

To this end, the method, of the invention, moreover in accordance with the above preamble, is essentially characterized in that it furthermore comprises operations consisting:

in identifying, in the set of versions of specific data, at least one standard version containing specific data that are also contained in at least one other version of the set, which version is thus identified as constituting a variant of this standard version, in deleting, from, each variant, at least one sequence of data containing specific data already contained in the corresponding standard version, and in retaining a location trace for each sequence of deleted data, and in recording in the rewritable memory, in addition to the common calibration data, and in the guise of a set of versions of specific data, a summary file of the specific calibration data containing at least each standard version, each corresponding variant, and a header containing references of the various models of complete calibration data and location data correlated with said references and locating, in the summary file, each standard version, each variant, and each sequence of deleted data.

Provision may furthermore be made for the data of each standard version to be compressed before recording of the summary file by means of a compression algorithm, and for the header of this file to comprise a descriptor of this algorithm.

Preferably, each standard version is chosen, in the set of versions of specific data, as a version which contains the largest number of specific data that are also contained in at least two other versions of this set.

According to an advantageous mode of implementation of the invention, the set of common calibration data is recorded in the rewritable memory with the same structure as a model of complete calibration data of which each expanse of specific calibration data, has been erased without moving the common calibration data.

The invention also relates to a method for reconstructing, in the rewritable memory of an automobile electronic control unit and in response to the supplying of a reference, the model of complete calibration data which is tagged by this reference, on the basis of the calibration data stored in this memory by the method defined in the preceding paragraph, this method being characterized in that it comprises the steps consisting in:

identifying, on the basis of the data of the header of the summary file, whether the reference supplied corresponds to a standard version or to a variant and, in the latter case, identifying the corresponding standard version, loading into the random access memory of the electronic control unit, optionally several times, the standard version identified by the reference or the corresponding standard version, and decompressing it if necessary, if the reference supplied corresponds to a variant, replacing in the corresponding standard version the data of this standard version with the data of the variant while preserving, in the standard version, each sequence of data deleted in the variant, and continuing the processing with the standard version thus obtained, and recording in the rewritable memory the data of the standard version, while integrating them into the set of common calibration data, at each site indicated by the location data of the header of the summary file.

Other characteristics and advantages of the invention will emerge clearly from, the description thereof which is given hereinafter, by way of wholly nonlimiting indication, with reference to the single FIGURE, which consists of an implementation diagram for the storage method of the invention.

As announced previously, the invention relates to a method making it possible to store, in a rewritable memory of an automobile electronic control unit (ECU) and in a very compact form, calibration data functionally equivalent to a set of various models of complete calibration data.

The first line of the FIGURE illustrates, in a symbolic and wholly non-limiting manner, the structure of an arbitrary model of complete data, this model being generically dubbed Mi, where the index "i" represents any whole number, here chosen between 1 and 5 by simple way of example.

Stated otherwise, the first line of the FIGURE illustrates in a generic manner five different models of complete calibration data, dubbed M1, M2, M3, M4 and M5 respectively.

In fact, these various models comprise expanses of data that are identical from one model to the other, these data, being defined as common calibration data, and being designated in the FIGURE by the references COM1, COM2, COM3, and COM4.

The other data, or expanses of data, designated in a generic manner by SPi1, SPi2, and SPi3, are a priori specific to the model to which they belong, this model being generically dubbed Mi.

It is thus possible, starting from any model Mi chosen from among the various models M1 to M5 of complete calibration data and by deleting the specific data SPi1, SPi2, and SPi3, to construct a data set, dubbed CALIBAS, containing only common calibration data such as COM1, COM2, COM3 and COM4, and forming a calibration base.

Moreover, it is possible, starting from each of the models M1 to M5 of complete calibration data and by deleting the common calibration data COM1, COM2, COM3 and COM4, to define a corresponding version of specific calibration data.

More precisely, the latter operation makes it possible to define a version SP1 of specific data comprising the data SP11, SP12, and SP13, a version SP2 of specific data comprising the data SP21, SP22, and SP23, a version SP3 of specific data comprising the data SP31, SP32, and SP33, a version SP4 of specific data comprising the data SP41, SP42, and SP43, and a version SP5 of specific data comprising the data SP51, SP52, and SP53.

Stated otherwise, each of the versions SP1 to SP5 of specific data consists of a subset of a corresponding model, such as M1 to M5, of complete calibration data, and is disjoint from the set CALIBAS of common data, that is to say does not contain any of the data COM1, COM2, COM3, and COM4.

Instead of recording the set of various models M1 to M5 of complete calibration data, in the rewritable memory of the automobile electronic control unit, and therefore of storing the common calibration data COM1, COM2, COM3, and COM4 as many times as there exist models, it is a priori judicious, so as to reduce the memory space used, to record just the set CALIBAS of common calibration data and the various versions SP1 to SP5 of specific calibration data, these versions being stored in a concatenated, form and after deletion of the common calibration data, as illustrated in the eighth line of the FIGURE.

However, as it is indispensable to be able to reproduce a posteriori any one of the models M1 to M5 of complete calibration data on the basis of the data recorded in a more compact form, it is also necessary to record identification and location data making it possible to identify the various calibration models Mi, to identify, for each of the models Mi, the various expanses of specific data SPi1, SPi2 and SPi3 relating to this model, to identify the start address and end address of each of the expanses left empty in the set CALIBAS of common data by extracting the expanses of specific data such as SPi1, SPi2 and SPi3, and to identify the start addresses and end addresses of the various memory expanses in which the various expanses SP11, SP12, SP13, SP21, SP22, SP23, SP31, SP32, SP33, SP41, SP42, SP43, SP51, SP52, and SP53 of the various models are newly stored.

These identification and location data, which will henceforth be denoted $\{LBL; ADRD; ADRF\}_{ij}$, therefore comprise references $LBL_{ij}$, identifying the various calibration models Mi and the various expanses such as SPi1, SPi2 and SPi3 of specific data of these various models, the start addresses $ADRD_{ij}$ of the various expanses SPij of the various versions SPi of specific data at one and the same time in the regular model Mi and in the record illustrated on the eighth line of the drawing, and the end addresses $ADRF_{ij}$ of these same expanses SPij of specific data, likewise at one and the same time in the regular model Mi and in the record illustrated on the eighth line of the drawing, the index "i" being used here to refer to a particular model considered from among the set of models, and the index "j" being used to refer to a particular expanse of specific data of a particular model, considered from among the set of expanses of specific data of this model.

The invention, which proposes a yet more effective compacting of data, relies on highlighting the fact that, the various versions SPi of calibration data, although relating to specific data, could themselves be recorded in a substantially more condensed form.

This compacting may be understood on the basis of an analogy using groups of letters.

For example, when the respective data of two different versions SPi of specific data may be represented diagrammatically by strings of variables such as VWY and XWZ, it seems a priori hardly relevant to attempt to store these strings by storing on the one hand their unique common portion (W) and on the other hand the differences exhibited by these two strings with respect to their common portion, the storage of these data then requiring scarcely less memory room than that needed for the storage of the initial data, or indeed possibly more.

This, apparently obvious, intuition is nonetheless erroneous when, the number and the variety of different versions SPi of specific data increase.

To return to the simple case presented hereinabove, the additional existence of a version SPi of specific data complying with the structure XWY modifies the situation, since this version exhibits two structural elements that are common to each of the pre-existing versions, namely the elements WY for the version VWY, and the elements XW for the version XWZ, To exploit this new possibility of data compacting, the method of the invention comprises the following additional operations.

Firstly, one or more standard versions are identified in the set of versions SP1 to SP5 of specific data.

Each of the standard versions, denoted T1 and T2 in the example illustrated, is defined as a version of specific data which contains specific data also contained, in at Least one other version of specific data of the set of versions SP1 to SP5.

Preferably, each standard version is chosen, in the set of versions SP1 to SP5 of specific data, as the version or one of the versions which contains the largest number of specific data that are also contained in at least two other versions of this set.

In the above example of the versions VWY, XWZ, and XWY, the version XWY may be considered to be a standard version, since it exhibits the largest, number of data in common with the versions VWY and XWZ, namely the elements WY and XW, whereas these last two versions have only the one element W in common themselves.

The versions of the set SP1 to SP5 which are not identified as standard versions are identified as variants of the standard version or of one of the standard versions with which they exhibit the largest number of common data.

In the example illustrated, version SP1 is identified as a standard version denoted T1, version SP3 is identified as a standard version denoted T2, version SP2 is identified as a variant denoted V11 of standard version T1, version SP4 is identified as a first variant denoted V21 of standard version T2, and version SP5 is identified as a second variant denoted V22 of standard, version T2.

It is then possible to delete, in each variant such as V11, V21, and V22, one or more sequences of data containing specific data already contained in the corresponding standard version such as T1 and T2, subject to retaining, as previously, a location trace for each of the sequences of data deleted, that is to say the expanses $\{ADRD, ADRF\}_{ijk}$ of their start and end addresses, in conjunction with references $\{LBL\}_{ijk}$ identifying these sequences, the index "i" referring as previously to a particular model Mi, the index "j" referring as previously to a particular expanse of specific data of a particular model, considered from among the set of expanses of specific data of this model, and the new index "k" referring to a particular sequence from among the set of deleted sequences.

Thus, instead of recording in the rewritable memory of the electronic control unit the various models M1 to M5 of complete calibration data, the method of the invention proposes that the common calibration data COM1-COM4 and a summary file of the specific calibration data, denoted RCP_SP or RCP_SP', and containing each standard version such as T1 and T2, each corresponding variant such as V11, V21, V22, and a header ETT or ETT', be recorded in this memory.

The header ETT or ETT' contains the references $\{LET\}_{ijk}$ of the various models M1 to M5 liable to be used of complete calibration data, and the references of the various sequences resulting from splitting these data, as well as the location data $\{ADRD, ADRF\}_{ijk}$ correlated with the references $\{LBL\}_{ijk}$ and locating, through their start, and end addresses, each standard version T1 or T2 at one and the same time in the summary file RCP_SP or RCP_SP' and within the set CALIBAS of common data, and each variant V11, V21, or V22 at one and the same time in the summary file RCP_SP or RCP_SP' and within each standard version T1 or T2, that is to say by retaining a trace of the site of each sequence of deleted data.

The data of each standard version can furthermore be compressed according to conventional techniques before the recording of the corresponding summary file by means of a compression algorithm.

In this case, which corresponds to the notations T'1, T'2, ETT' and RCP_SP', the header ETT' of the file RCP_SP' comprises a descriptor ALGO of the compression algorithm used.

To facilitate the a posteriori utilization of the stored calibration data, the common calibration data such as COM1 to COM4 are preferably recorded in the rewritable memory of the electronic control unit in the form of the set CALIBAS of these common data, that is to say with the same structure as a model Mi of complete calibration data of which each expanse of specific calibration data such as SPi1 to SPi3 has been erased, without moving the common calibration data COM1 to COM4.

The data which are recorded in the rewritable memory of the automobile electronic control unit, and whose structure has been described hereinabove, can for example be prepared in advance in a processor independent of this electronic control unit as a function of requirements, and in particular as a function of the models of complete calibration data, such as M1 to M5, that this electronic control unit is presumed to be able to use.

On the other hand, the inverse method, which consists in reconstructing any one of the models M1 to M5 of complete calibration data on the basis of the data stored in the rewritable memory of the automobile electronic control unit, must be implemented in this electronic control unit itself, for example at the end of the assembly line of the vehicle using one of these calibration models.

Accordingly, an electronic tool of this assembly line transmits to the "Boot Loader" software of the electronic control unit the reference LBL which identifies, from among the set of a priori usable models M1 to M5, the model of complete calibration data which has to be reconstructed in this electronic control unit.

In response to this information, the "Boot Loader" software identifies, on the basis of the data of the header ETT or ETT' of the summary file RCP_SP or RCP_SP', whether the reference LBL supplied corresponds, as regards the specific calibration data, to a standard version such as T1, T'1 or T2, T'2, or to a variant such as V11, V21, or V22.

If it is a variant, the standard version corresponding to this variant is itself identified.

The standard version identified by the reference LBL, or the standard version corresponding to the variant identified by this reference, is then loaded into the random access memory of the electronic control unit, optionally several times, and decompressed if necessary.

If the supplied reference LBL corresponds to a variant such as V11, V21, or V22, the data of this variant will replace the corresponding data of the standard version T1 or T2 corresponding to this variant. This operation is implemented while preserving, in the standard version, each sequence of data consisting of data deleted from the variant, and the processing is continued with the standard version thus obtained.

The specific data of this standard version are then recorded in the rewritable memory of the electronic control unit, these data being integrated into the set CALIBAS of common calibration data, at each appropriate site such as indicated by the location data $\{ADRD, ADRF\}_{ijk}$ of the header ETT of the summary file RCP_SP.

The invention claimed is:

1. A method for storing, in a rewritable memory of an automobile electronic control unit, calibration data functionally equivalent to a set of various models (M1-M5) of complete calibration data, this method comprising operations consisting in recording in the rewritable memory a set (CALIBAS) of common calibration data (COM1-COM4), consisting of the calibration data common to the various models (M1-M5) of complete data, and a set of versions (SP1-SP5) of specific calibration data, each version (SP1-SP5) of specific data consisting of a subset of a corresponding model (M1-M5) of complete data and being disjoint from the set (CALIBAS) of common data, said method comprising:

identifying, in the set of versions (SP1-SP5) of specific data, at least one standard version (T1,T2) containing specific data that are also contained in at least one other version (SF2, SP4, SF5) of the set, said at least one other version is thus identified as constituting a variant (V11; V21, V22) of this standard version, deleting, from each variant (V11; V21, V22), at least one sequence of data containing specific data already contained in the corresponding standard version (T1; T2), and retaining a location trace ($\{ADRD, ADRF\}_{ijk}$) for each sequence of deleted data, and recording in the rewritable memory, in addition to the common calibration data (COM1-COM4) and in the guise of a set of versions (SP1-SP5) of specific data, a summary file (RCP_SP, RCP_SP') of the specific calibration data containing at least each standard version (T1; T2), each corresponding variant (V11; V21, V22), and a header (ETT) containing references ($\{LBL\}_{ijk}$) of the various models (M1-M5) of complete calibration data and location data ($\{ADRD, ADRF\}_{ijk}$) correlated with said references ($\{LBL.\}_{ijk}$) and locating, in the summary file (RCP_SP, RCP_SP'), each standard version (T1; T2), each variant (V11; V21, V22), and each sequence of deleted data.

2. The method as claimed in claim 1, wherein the data of each standard version (T1'; T2') are compressed before recording of the summary the (RCF SF) by means of a compression algorithm, and in that the header (ETT') of this the comprises a descriptor (ALGO) of this algorithm, 3. The method as claimed in claim 1, wherein each standard version (T2) is chosen, in the set of versions (SP1-SP5) of specific data, as a version which contains the largest number of specific data that are also contained in at least two other versions (SP4, SF5) of this set.

4. The method as claimed in claim 1, wherein the set (CALIBAS) of common calibration data (COM1-COM4) is recorded in the rewritable memory with the same structure as a model (M) of complete calibration data of which each expanse of specific calibration data (SPi1-SPi3) has been erased without moving the common calibration data (COM1-COM4).

5. A method for reconstructing, in the rewritable memory of an automobile electronic control unit and in response to the supplying of a reference (LBL), the model (Mi) of complete calibration data which is tagged by this reference (LBL), on the basis of the calibration data stored in this memory by the method as claimed in claim 4, further comprising:

identifying, on the basis of the data of the header (ETT, ETT') of the summary the (RCP_SP RCP_SP'), whether the reference supplied (LBL) corresponds to a standard version (T1, T'1; T2, T'2) or to a variant (V11; V21,V22) and, in the latter case, identifying the corresponding standard version (T1, T'1; T2, T'2);

loading into the random access memory of the electronic control unit, optionally several times, the standard version (T1, T'1; T2, T'2) identified by the reference (LBL) or the corresponding standard version (T1, T'1; T2, T'2), and decompressing it if necessary;

if the reference supplied (LBL) corresponds to a variant (V11; V21, V22), replacing in the corresponding standard version (T1; T2) the data of this standard version with the data of the variant (V11; V21, V22) while preserving, in the standard version (T1; T2), each sequence of data deleted in the variant (V11; V21, V22), and continuing the processing with the standard version (T1; T2) thus obtained and;

recording in the rewritable memory the data of the standard version obtained (T1, T2), while integrating them into the set (CALIBAS) of common calibration data (COM1-COM4) at each site indicated by the location data ($\{ADRD, ADRF\}ijk$) of the header (ETT) of the summary file (RCP_SP).

6. The method as claimed in claim 2, wherein each standard version (T2) is chosen, in the set of versions (SP1-SP5) of specific data, as a version which contains the largest number of specific data that are also contained in at least two other versions (SF4, SF5) of this set.

7. The method as claimed in claim 2, wherein the set (CALIBAS) of common calibration data (COM1-COM4) is recorded in the rewritable memory with the same structure as a model (Mi) of complete calibration data of which each expanse of specific calibration data (SPi1-SPi3) has been erased without moving the common calibration data (COM1-COM4).

8. The method as claimed in claim 3, wherein the set (CALIBAS) of common calibration data (COM1-COM4) is recorded in the rewritable memory with the same structure as a model (Mi) of complete calibration data of which each expanse of specific calibration data (SPi1 -SPi3) has been erased without moving the common calibration data (COM1-COM4).

9. A method for reconstructing, in the rewritable memory of an automobile electronic control unit and in response to the supplying of a reference (LBL), the model (Mi) of complete calibration data which is tagged by this reference (LBL), on the basis of the calibration data stored in this memory by the method as claimed in claim 7, further comprising:

identifying, on the basis of the data of the header (ETT, ETT') of the summary the (RCP_SF, RCP_SF'), whether the reference supplied (LBL) corresponds to a standard version (T1, T'1; T2, T'2) or to a variant (V11; V21,V22) and, in the latter case, identifying the corresponding standard version (T1, T'1; T2, T'2);

loading into the random access memory of the electronic control unit, optionally several times, the standard version (T1, T'1; T2, T'2) identified by the reference (LBL) or the corresponding standard version (T1, T'1; T2, T'2), and decompressing it if necessary;

if the reference supplied (LBL) corresponds to a variant (V11; V21, V22), replacing in the corresponding standard version (T1; T2) the data of this standard version with the data of the variant (V11; V21, V22) while preserving, in the standard version (T1; T2), each sequence of data deleted in the variant (V11; V21, V22), and continuing the processing with the standard version (T1; T2) thus obtained and;

recording in the rewritable memory the data of the standard version obtained (T1, T2), while integrating them into the set (CALIBAS) of common calibration data (COM1-COM4) at each site indicated by the location data ({ADRD, ADRF}ijk) of the header (ETT) of the summary file (RCP_SP).

10. A method for reconstructing, in the rewritable memory of an automobile electronic control unit and in response to the supplying of a reference (LBL), the model (Mi) of complete calibration data which is tagged by this reference (LBL), on the basis of the calibration data stored in this memory by the method as claimed in claim 8, further comprising:

identifying, on the basis of the data of the header (ETT, ETT') of the summary the (RCP_SP, RCP_SP'), whether the reference supplied (LBL) corresponds to a standard version (T1, T'1; T2, T'2) or to a variant (V11; V21, V22) and, in the latter case, identifying the corresponding standard version (T1, T'1; T2, T'2);

loading into the random access memory of the electronic control unit, optionally several times, the standard version (T1, T'1; T2, T'2) identified by the reference (LBL) or the corresponding standard version (T1, T'1; T2, T'2), and decompressing it if necessary;

if the reference supplied (LBL) corresponds to a variant (V11; V21, V22), replacing in the corresponding standard version (T1; T2) the data of this standard version with the data of the variant (V11; V21, V22) while preserving, in the standard version (T1; T2), each sequence of data deleted in the variant (V11; V21, V22), and continuing the processing with the standard version (T1; T2) thus obtained and;

recording in the rewritable memory the data of the standard version obtained (T1, T2), while integrating them into the set (CALIBAS) of common calibration data (COM1-COM4) at each site indicated by the location data ({ADRD, ADRF}ijk) of the header (ETT) of the summary file (RCP_SP).

\* \* \* \* \*